(12) United States Patent
Chan et al.

(10) Patent No.: US 9,025,238 B2
(45) Date of Patent: May 5, 2015

(54) PIEZO ELECTROPHORETIC DISPLAY

(71) Applicant: SiPix Imaging, Inc., Fremont, CA (US)

(72) Inventors: Bryan Hans Chan, San Francisco, CA (US); Craig Lin, San Jose, CA (US); HongMei Zang, Fremont, CA (US)

(73) Assignee: E Ink California, LLC, Fremont, CA (US)

( * ) Notice: Subject to any disclaimer, the term of this patent is extended or adjusted under 35 U.S.C. 154(b) by 0 days.

(21) Appl. No.: 13/916,498

(22) Filed: Jun. 12, 2013

(65) Prior Publication Data

US 2013/0342892 A1    Dec. 26, 2013

Related U.S. Application Data

(60) Provisional application No. 61/662,274, filed on Jun. 20, 2012.

(51) Int. Cl.
*G02B 26/00* (2006.01)
*G09G 3/34* (2006.01)
(Continued)

(52) U.S. Cl.
CPC .............. *G02F 1/167* (2013.01); *G02B 26/026* (2013.01); *G09G 3/34* (2013.01); *G09G 3/344* (2013.01); *G09G 3/3433* (2013.01); *H01L 41/08* (2013.01); *H01L 41/0805* (2013.01); *H01L 41/293* (2013.01); *H01L 41/297* (2013.01); *B06B 1/06* (2013.01); *B06B 1/0659* (2013.01);
(Continued)

(58) Field of Classification Search
CPC ...................... G02F 1/00; G02F 1/167; G02F 2001/133394; G02F 2001/167; G02F 2001/1672; G09G 3/344; G09G 2380/02; G09G 3/34; B06B 1/06; B06B 1/0644; B06B 1/0659; B06B 1/0688; H01L 41/08; H01L 41/0805; H01L 41/293; H01L 41/297; H01L 41/31; H01L 41/312; H01L 41/35; G02B 26/00; G02B 26/026
USPC .......... 359/290, 295, 296; 345/76, 80, 84, 85, 345/107, 108; 310/328, 364, 365; 347/68
See application file for complete search history.

(56) References Cited

U.S. PATENT DOCUMENTS 4,046,456 A * 9/1977 Bonne ........................... 359/296
5,930,026 A    7/1999 Jacobson et al.
(Continued)

FOREIGN PATENT DOCUMENTS

JP    2010-085528    4/2010
KR    10-2007-0082346    8/2007
(Continued)

OTHER PUBLICATIONS

PCT/US2013/045394 International Search Report, mailed Sep. 23, 2013.
(Continued)

*Primary Examiner* — Loha Ben
(74) *Attorney, Agent, or Firm* — Perkins Coie LLP

(57) ABSTRACT

The invention is directed to a variety of designs of piezo electrophoretic displays which may be driven without connecting to a power source. The piezo-electrophoretic display comprises an electrophoretic layer, a conductor layer, and a layer of piezo material. The processes for manufacturing the piezo electrophoretic displays are also provided.

12 Claims, 14 Drawing Sheets

(51) Int. Cl.
| | |
|---|---|
| G02F 1/167 | (2006.01) |
| G02B 26/02 | (2006.01) |
| H01L 41/08 | (2006.01) |
| H01L 41/293 | (2013.01) |
| H01L 41/297 | (2013.01) |
| B06B 1/06 | (2006.01) |
| H01L 41/31 | (2013.01) |
| H01L 41/312 | (2013.01) |
| H01L 41/35 | (2013.01) |
| G02F 1/1333 | (2006.01) |

(52) U.S. Cl.
CPC .... G02F2001/1672 (2013.01); G09G 2380/02 (2013.01); H01L 41/31 (2013.01); H01L 41/312 (2013.01); H01L 41/35 (2013.01); B06B 1/0644 (2013.01); G02F 2001/133394 (2013.01)

(56) References Cited

U.S. PATENT DOCUMENTS

| | | | |
|---|---|---|---|
| 6,130,773 A | 10/2000 | Jacobson et al. | |
| 6,373,461 B1* | 4/2002 | Hasegawa et al. | 345/107 |
| 6,796,637 B2* | 9/2004 | Kitagawa et al. | 347/68 |
| 6,842,166 B2* | 1/2005 | Hasegawa et al. | 345/107 |
| 6,859,302 B2* | 2/2005 | Liang et al. | 359/296 |
| 6,930,818 B1 | 8/2005 | Liang et al. | |
| 6,993,813 B2* | 2/2006 | Kitagawa et al. | 29/25.35 |
| 7,044,586 B2* | 5/2006 | Takeuchi et al. | 347/68 |
| 7,616,375 B2* | 11/2009 | Hirai et al. | 359/296 |
| 2011/0242014 A1 | 10/2011 | Tsai et al. | |

FOREIGN PATENT DOCUMENTS

| | | |
|---|---|---|
| KR | 10-2008-0094252 | 10/2008 |
| WO | WO 01/67170 | 9/2001 |

OTHER PUBLICATIONS

U.S. Appl. No. 61/662,274, filed Jun. 20, 2012, Chan et al.
Nikkei Microdevices. (Dec. 2002) Newly-Developed Color Electronic Paper Promises—Unbeatable Production Efficiency. *Nikkei Microdevices*, p. 3. (in Japanese, with English translation).
Liang, R.C., Hou, J., & Zang, H.M. (Dec. 2002) Microcup Electrophoretic Displays by Roll-to-Roll Manufacturing Processes. *IDW*, EP2-2, 1337-1340.
Liang, R.C. (Feb. 2003) *Microcup® Electrophoretic and Liquid Crystal Displays by Roll-to-Roll Manufacturing Processes*. Presentation conducted at the Flexible Microelectronics & Displays Conference of U.S. Display Consortium, Phoenix, Arizona, USA.
Liang, R.C., & Tseng, S. (Feb. 2003). *Microcup® LCD, A New Type of Dispersed LCD by a Roll-to-Roll Manufacturing Process*. Paper presented at the IDMC, Taipei, Taiwan.
Liang, R.C., Hou, J., Zang, H.M., & Chung, J. (Feb. 2003). *Passive Matrix Microcup® Electrophoretic Displays*. Paper presented at the IDMC, Taipei, Taiwan.
Liang, R.C., Hou, J., Zang, H.M., Chung, J., & Tseng, S. (Feb. 2003). Microcup® Displays: Electronic Paper by Roll-to-Roll Manufacturing Processes. *Journal of the SID*, 11(4) 621-628.
Chen, S.M. (May 2003) The New Application and the Dynamics of Companies. *TRI*. 1-10. (In Chinese, English abstract attached).
Liang, R.C., Hou, J., Chung, J., Wang, X., Pereira, C., & Chen, Y. (May 2003). Microcup® Active and Passive Matrix Electrophoretic Displays by a Roll-to-Roll Manufacturing Processes. *SID Digest*, vol. 34, Issue 1, pp. 838-841, 20.1.
Lee, H., & Liang, R.C. (Jun. 2003) SiPix Microcup® Electronic Paper—An Introduction. *Advanced Display*, Issue 37, 4-9 (in Chinese, English abstract attached).
Chen, S.M. (Jul. 2003) The Applications for the Revolutionary Electronic Paper Technology. *OPTO News & Letters*, 102, 37-41. (in Chinese, English abstract attached).

Zang, H.M., & Liang, R.C. (2003) Microcup Electronic Paper by Roll-to-Roll Manufacturing Processes. *The Spectrum*, 16(2), 16-21.
Allen, K. (Oct. 2003). Electrophoretics Fulfilled. *Emerging Displays Review: Emerging Display Technologies, Monthly Report—Oct. 2003*, 9-14.
Kleper, M., Miller, P., Miller L. (Oct. 2003) An Investigation of the Emerging and Deveolping Technologies Related to the Generation Beyond Print-on-Paper. *Advanced Display Technologies*, Oct. 2003, pp. 13-15, Rochester Institute of Technology (R.I.T.).
Zang, H.M. (Oct. 2003). *Microcup® Electronic Paper by Roll-to-Roll Manufacturing Processes*. Presentation conducted at the Advisory Board Meeting, Bowling Green State University, Ohio, USA.
Chung, J., Hou, J., Wang, W., Chu, L.Y., Yao, W., & Liang, R.C. (Dec. 2003). Microcup® Electrophoretic Displays, Grayscale and Color Rendition. *IDW*, AMD2/EP1-2, 243-246.
Ho, C., & Liang, R.C. (Dec. 2003). *Microcup ® Electronic Paper by Roll-to-Roll Manufacturing Processes*. Presentation conducted at FEG, Nei-Li, Taiwan.
Zang, H.M, Hwang, J.J., Gu, H., Hou, J., Weng, X., Chen, Y., et al. (Jan. 2004). Threshold and Grayscale Stability of Microcup® Electronic Paper. *Proceeding of SPIE—IS&T Electronic Imaging, SPIE* vol. 5289, 102-108.
Zang, H.M. (Feb. 2004). *Microcup Electronic Paper*. Presentation conducted at the Displays & Microelectronics Conference of U.S. Display Consortium, Phoenix, Arizona, USA.
Wang, X., Kiluk, S., Chang, C,, & Liang, R.C. (Feb. 2004). Mirocup® Electronic Paper and the Converting Processes. *ASID*, 10.1.2-26, 396-399, Nanjing, China.
Chaug, Y.S., Haubrich, J.E., Sereda, M. and Liang, R.C. (Apr. 2004). Roll-to-Roll Processes for the Manufacturing of Patterned Conductive Electrodes on Flexible Substrates. *Mat. Res. Soc. Symp. Proc.*, vol. 814, I9.6.1.
Liang, R.C. (Apr. 2004). *Microcup Electronic Paper by Roll-to-Roll Manufacturing Process*. Presentation at the Flexible Displays & Electronics 2004 of Intertech, San Francisco, California, USA.
Hou, J., Chen, Y., Li, Y., Weng, X., Li, H. and Pereira, C. (May 2004). Reliability and Performance of Flexible Electrophoretic Display by Roll-to-Roll Manufacturing Processes. *SID Digest*, 32.3, 1066-1069.
Wang, X., Kiluk, S., Chang, C., & Liang, R.C., (Jun. 2004) Microcup® Electronic Paper and the Converting Processes. *Advanced Display*, Issue 43, 48-51 (in Chinese, with English abstract).
Liang, R.C., Zang, H.M., Wang, X., Chung, J. & Lee, H., (Jun./Jul. 2004) << Format Flexible Microcup® Electronic Paper by Roll-to-Roll Manufacturing Process >>, Presentation conducted at the 14th FPD Manufacturing Technology EXPO & Conference.
Liang, R.C. (Oct. 2004) *Flexible and Roll-able Displays/Electronic Paper—A Technology Overview*. Paper presented at the METS 2004 Conference in Taipie, Taiwan.
Bardsley, J.N. & Pinnel, M.R. (Nov. 2004) Microcup™ Electrophoretic Displays. *USDC Flexible Display Report*, 3.1.2. pp. 3-12-3-16.
Ho, Candice. (Feb. 1, 2005) *Microcupt® Electronic Paper Device and Application*. Presentation conducted at USDC 4th Annual Flexible Display Conference 2005.
Zang, H.M. & Hou, Jack, (Feb. 2005) *Flexible Microcup® EPD by RTR Process*. Presentation conducted at 2$^{nd}$ Annual Paper-Like Displays Conference, Feb. 9-11, 2005, St. Pete Beach, Florida.
Liang, R.C., (Feb. 2005) *Flexible and Roll-able Displays/Electronic Paper—A Brief Technology Overview*. Flexible Display Forum, 2005, Taiwan.
Wang, X., Li, P., Sodhi, D., Xu, T. And Bruner, S. et al., (Feb. 2006) *Inkjet Fabrication of Multi-Color Microcup® Electrophorectic Display*. The Flexible Microelectronics & Displays Conference of U.S. Display Consortium.
Zang, H.M., Wang, W., Sun, C., Gu, H., and Chen, Y. (May 2006) Monochrome and Area Color Microcup® EPDs by Roll-to-Roll Manufacturing Processes. *ICIS' 06 International Congress of Imaging Science Final Program and Proceedings*, pp. 362-365.

(56) References Cited

OTHER PUBLICATIONS

Wang, X., Zang, H.M. And Li, P. (Jun. 2006) Roll-to-Roll Manufacturing Process for Full Color Electrophoretic film. *SID Digest*, 00pp. 1587-1589.

Zang, H.M, (Sep. 2006) *Monochrome and Area Color Microcup® EPDs by Roll-to-Roll Manufacturing Process*. Presentation conducted at the Fourth Organic Electronics Conference and Exhibition (OEC-06), Sep. 25-27, 2006, Frankfurt, Germany.

Ho, Andrew. (Nov. 2006) *Embedding e-Paper in Smart Cards, Pricing Labels & Indicators*. Presentation conducted at Smart Paper Conference Nov. 15-16, 2006, Atlanta, GA, USA.

Zang, H.M. (Feb. 2007) *Developments in Microcup® Flexible Display*. Presentation conducted at the 6th Annual Flexible Display and Microelectronics Conference, Phoenix, AZ Feb. 6-8.

Zang, H.M., Wang, F., Kang, Y.M., Chen, Y. and Lin, W. (Jul. 2007) *Microcup® e-Paper for Embedded and Flexible Design*. IDMC'07, Taipei International Convention Center, Taiwan.

Sprague, R.A. (Sep. 23, 2009) SiPix Microcup Electrophoretic Epaper for Ebooks. *NIP 25*, 2009 pp. 460-462. (Presentation conducted on Sep. 23, 2009 at the 25th Int'l Conference on Digital Printing Technologies, Digital Fabrication 2009 (NIP 25) by Society for Imaging.

\* cited by examiner

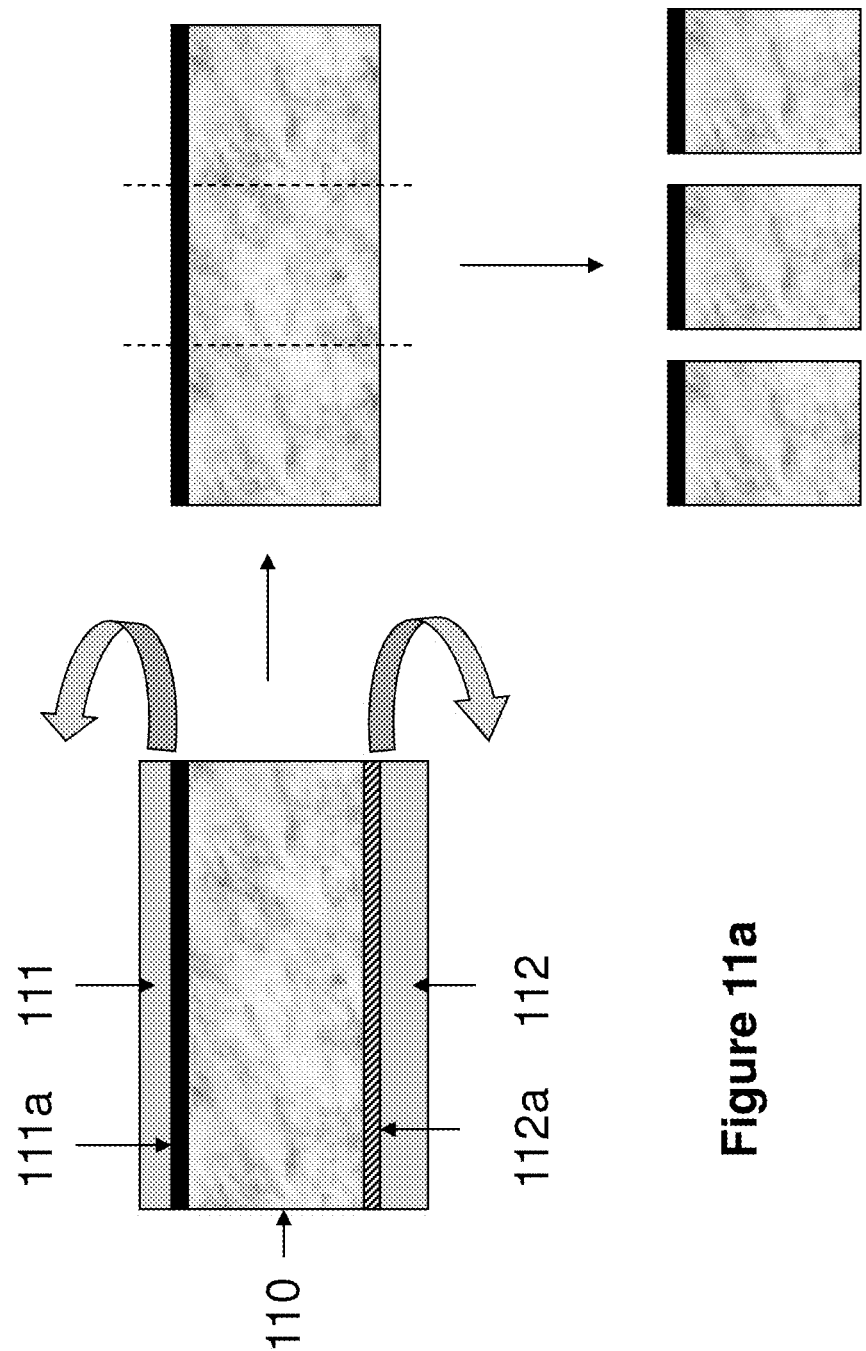

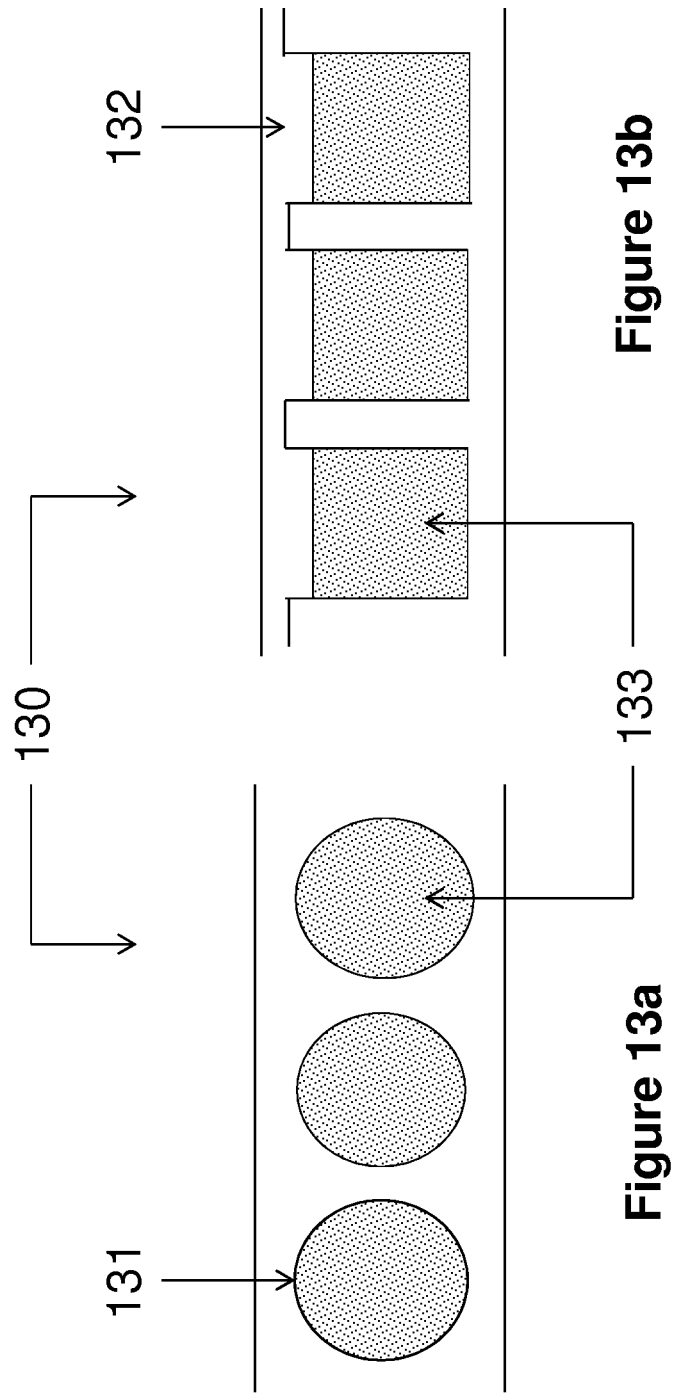

PIEZO ELECTROPHORETIC DISPLAY

This application claims priority to U.S. Provisional Application No. 61/662,274 filed Jun. 20, 2012, the content of which is incorporated herein by reference in its entirety.

FIELD OF THE INVENTION

The present invention is directed to piezo electrophoretic displays which may be driven without connecting to a power source, and methods for their manufacture.

BACKGROUND OF THE INVENTION

The electrophoretic display (EPD) is a non-emissive device based on the electrophoresis phenomenon of charged pigment particles dispersed in a solvent or solvent mixture. The display typically comprises two plates with electrodes placed opposing each other. One of the electrodes is usually transparent. An electrophoretic fluid composed of a colored solvent with charged pigment particles dispersed therein is enclosed between the two plates. When a voltage difference is imposed between the two electrodes, the pigment particles migrate to one side or the other causing either the color of the pigment particles or the color of the solvent being seen from the viewing side.

Alternatively, an electrophoretic fluid may comprise two types of charged pigment particles of contrasting colors and carrying opposite charges, and the two types of the charged pigment particles are dispersed in a clear solvent or solvent mixture. In this case, when a voltage difference is imposed between the two electrode plates, the two types of the charged pigment particles would move to opposite ends (top or bottom) in a display cell. Thus one of the colors of the two types of the charged pigment particles would be seen at the viewing side of the display cell.

The driving of an electrophoretic display requires a power source, such as a battery to provide power to the display and/or its driving circuitry. The power source may be a driver IC in order to generate an electric field. The electric field may also need to be enhanced by a circuitry. In any case, a physical connection through wires is required to attach the power source to the electrophoretic display and its driving circuitry.

SUMMARY OF THE INVENTION

The present invention is directed to a piezo-electrophoretic display which comprises an electrophoretic layer, a conductor layer and a layer of piezo material. The electrophoretic layer and the layer of piezo material may share the conductor layer. The electrophoretic layer and the layer of piezo material may share the conductor layer through a conductor line.

In one embodiment, the display comprises (a) a first layer of piezo material sandwiched between a first conductor layer and a second conductor layer, (b) a second layer of piezo material sandwiched between a third conductor layer and a fourth conductor layer and (c) an electrophoretic layer sandwiched between the second conductor layer and the third conductor layer. The first conductor layer and the fourth conductor layer may be connected.

In one embodiment, the display comprises an electrophoretic layer sandwiched between a first conductor layer and a second conductor layer and a layer of piezo material sandwiched between a third conductor layer and a fourth conductor layer, wherein the first conductor layer and the third conductor layer are connected and the second conductor layer and the fourth conductor layer are connected.

In one embodiment, the display comprises an electrophoretic layer and a layer of piezo material, both of which are sandwiched between two conductor layers.

In one embodiment, the display comprises an electrophoretic layer sandwiched between a first conductor layer and a third conductor layer and a layer of piezo material sandwiched between a second conductor layer and the third conductor layer, wherein the first conductor layer and the second conductor layer are connected.

In one embodiment, the display comprises a layer of piezo material sandwiched between a first conductor layer and a second conductor layer and an electrophoretic layer sandwiched between the second conductor layer and a third conductor layer. The first conductor layer and the third conductor layer may be connected.

In one embodiment, a piezo-electrophoretic display comprises an electrophoretic layer sandwiched between two layers of piezo material.

In one embodiment, a piezo-electrophoretic display comprises an electrophoretic layer sandwiched between a first conductor layer and a second conductor layer and a layer of piezo material which, on one side, is in contact with the first conductor layer and the second conductor layer, and on the other side, is in contact with a third conductor layer, wherein the layer of the piezo material and the third conductor layer are folded into a U-shape. The electrophoretic layer may be unfolded or folded.

In one embodiment, the electrophoretic layer is microcup-based. In another embodiment, the electrophoretic layer is microcapsule-based.

BRIEF DESCRIPTION OF THE DRAWINGS

FIGS. 11a and 11b illustrate how a substrate-less electrophoretic film may be prepared.

FIGS. 13a and 13b depict microcup-based and microcapsule-based electrophoretic layer, respectively.

DETAILED DESCRIPTION OF THE INVENTION

The present inventors have now found certain piezo electrophoretic display structural designs which do not need a battery source or wired power supply in order for the electrophoretic display to operate. The assembly of such an electrophoretic display is therefore simplified.

Piezoelectricity is the charge which accumulates in a solid material in response to applied mechanical stress. Suitable materials for the present invention may include polyvinylidene fluoride (PVDF), quartz ($SiO_2$), berlinite ($AlPO_4$), gallium orthophosphate ($GaPO_4$), tourmaline, barium titanate ($BaTiO_3$), lead zirconate titanate (PZT), zinc oxide (ZnO), aluminum nitride (AlN), lithium tantalate, lanthanum gallium silicate, potassium sodium tartrate and any other known piezo materials.

FIGS. 1-10 illustrate various structural designs of the present invention.

Figure 1:
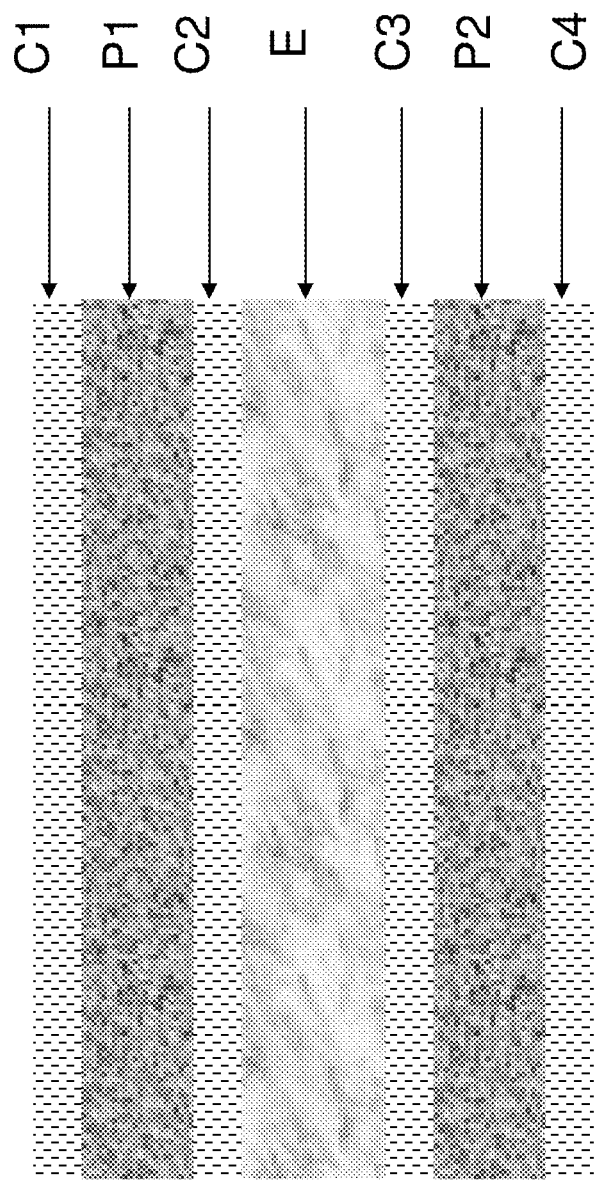
FIGS. 1-10 illustrate various structural designs of the present invention.

In FIG. 1, there are four conductor layers (C1-C4). A first layer of a piezo material (P1) is sandwiched between C1 and C2 and a second layer of a piezo material (P2) is sandwiched between C3 and C4. The electrophoretic layer (E) is sandwiched between C2 and C3. The piezo materials, P1 and P2, when applied mechanical stress, generate a voltage potential difference between C1 & C2 and C3 & C4, respectively. The voltage potential difference between C2 and C3, in turn, drives the electrophoretic layer E.

The "electrophoretic layer" (130 in FIGS. 13a and 13b), in the context of the present invention, may comprise micro-containers filled with an electrophoretic fluid. The micro-containers may be microcapsules (as described in U.S. Pat. No. 5,930,026) (131) or microcups (as described in U.S. Pat. No. 6,930,818) (132). The electrophoretic fluid (133) comprises one, two or more types of charged pigment particles dispersed in a solvent or solvent mixture.

It is noted that the term "electrophoretic layer" or "electrophoretic film" does not include a plastic substrate layer (e.g., PET) or a conductor layer (e.g., ITO). Therefore, an "electrophoretic layer or film" may also be referred to as a "substrate-less electrophoretic layer or film". More details of the term "electrophoretic layer or film" are given in a section below.

The piezo-electrophoretic display of FIG. 1 may be prepared in a variety of ways. For example, a layer of piezo material may be sandwiched between two conductor layers by lamination. Alternatively, a piezo material sandwiched between two conductor layers may be obtained commercially. An electrophoretic layer (E) may then be built on top of C3-P2-C4 and another layer of piezo material (P1) sandwiched between C1 and C2 is laminated over the electrophoretic layer (E). Alternatively, an electrophoretic layer may be sandwiched between the two sets of conductor-piezo-conductor layers, by lamination.

Figure 2:
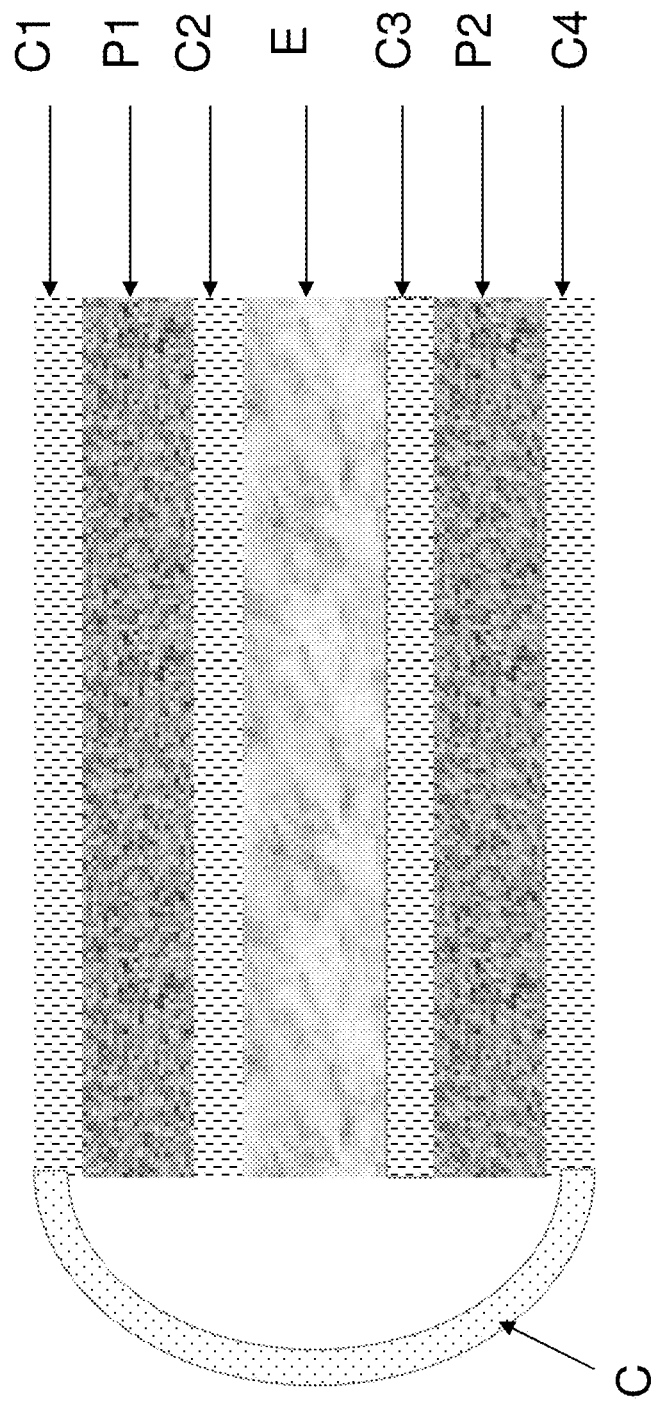

The design in FIG. 2 is similar to that in FIG. 1, except the conductor layers C1 and C4 are connected by a conductor line (C). In this case, C1 and C4 have the same voltage potential. The conductor line may be a connected line or a conductor sheet material which is folded to be in contact with both conductor layers C1 and C4.

Figure 3:
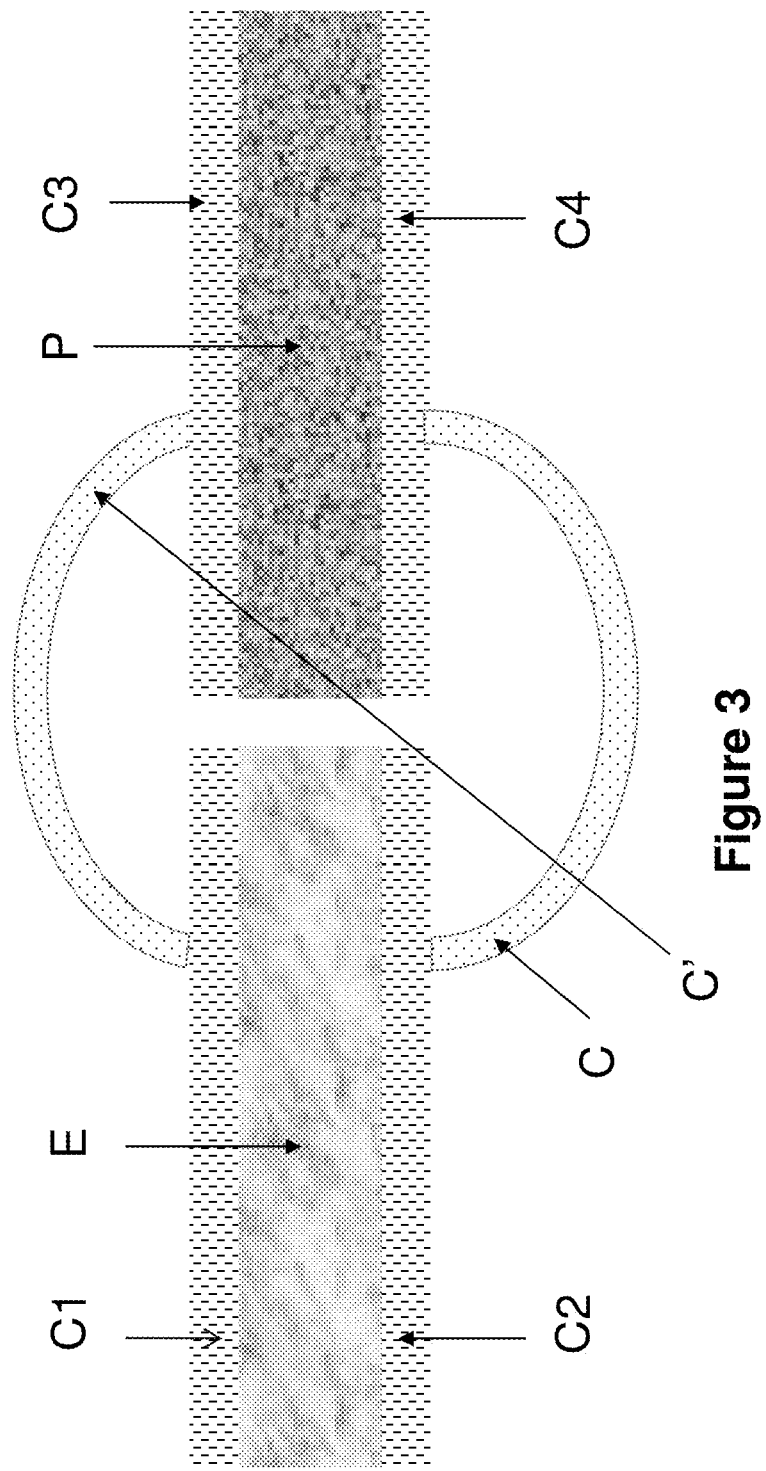

FIG. 3 depicts an alternative design. The electrophoretic layer (E) is sandwiched between conductor layers C1 and C2 and, separately, the piezo material layer (P) is sandwiched between conductor layers C3 and C4. But conductor layers C1 and C3 are connected through a conductor line C, and conductor layers C2 and C4 are connected through a conductor line C'. In this case, the voltage potential difference between C1 and C2 is the same as the voltage potential difference between C3 and C4 generated by the piezo material when it is applied mechanical stress.

As stated, a piezo material (P) sandwiched between two conductor layers (C3 and C4) is commercially available. An electrophoretic layer sandwiched between two conductor layers (C1 and C2) can be prepared by known methods.

Figure 4:
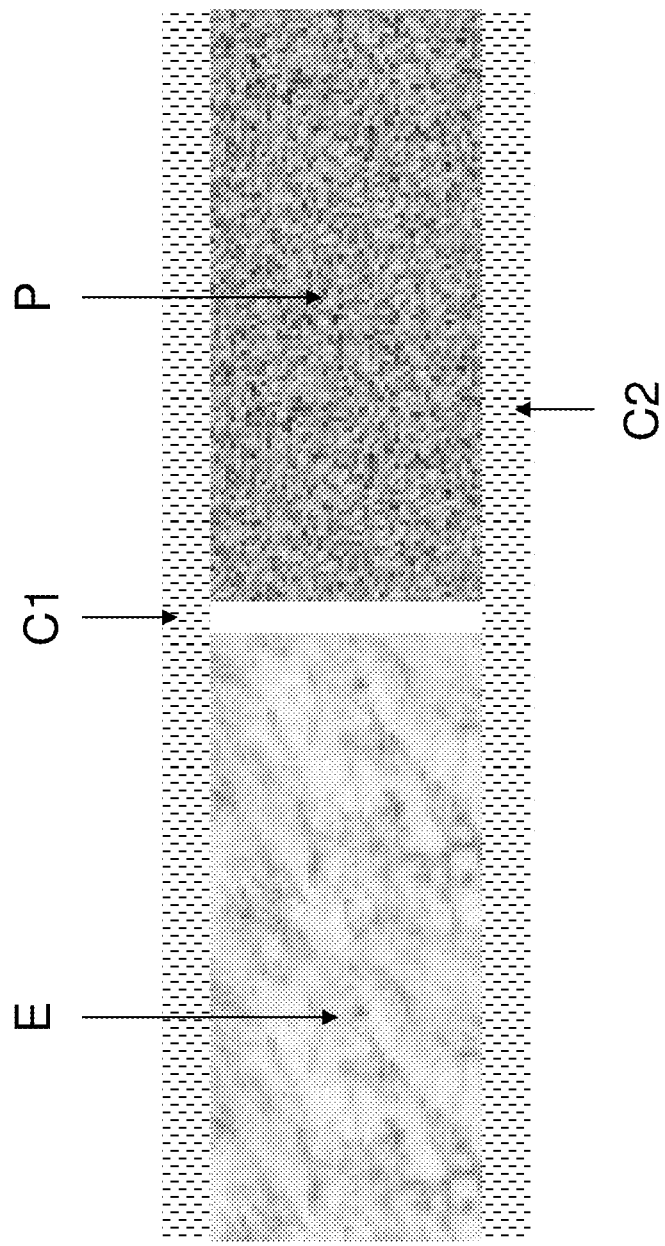

In FIG. 4, the electrophoretic layer E and the piezo material layer (P) share the conductor layers. As shown, both the electrophoretic layer (E) and the piezo material layer (P) are sandwiched between the conductor layers C1 and C2. Therefore the voltage potential difference generated by the piezo material would be used to drive the electrophoretic layer E.

The piezo-electrophoretic structure of FIG. 4 may be prepared in a number of ways. For example, a piezo material (P) and an electrophoretic layer (E) may be separately built on a conductor layer (C2) and finally another conductor layer (C1) is laminated over both the piezo material and the electrophoretic layer.

Alternatively, an electrophoretic layer may be built on C2 and part of the electrophoretic layer is then removed and the space previously occupied by the removed electrophoretic layer is then filled with a piezo material. A second conductor layer (C1) is then laminated over both the piezo material and the electrophoretic layer.

In the drawing, there appears to be a gap between the piezo material and the electrophoretic layer. However, the gap is not necessary. In other words, the electrophoretic layer may be in direct contact with the piezo material.

Figure 5:
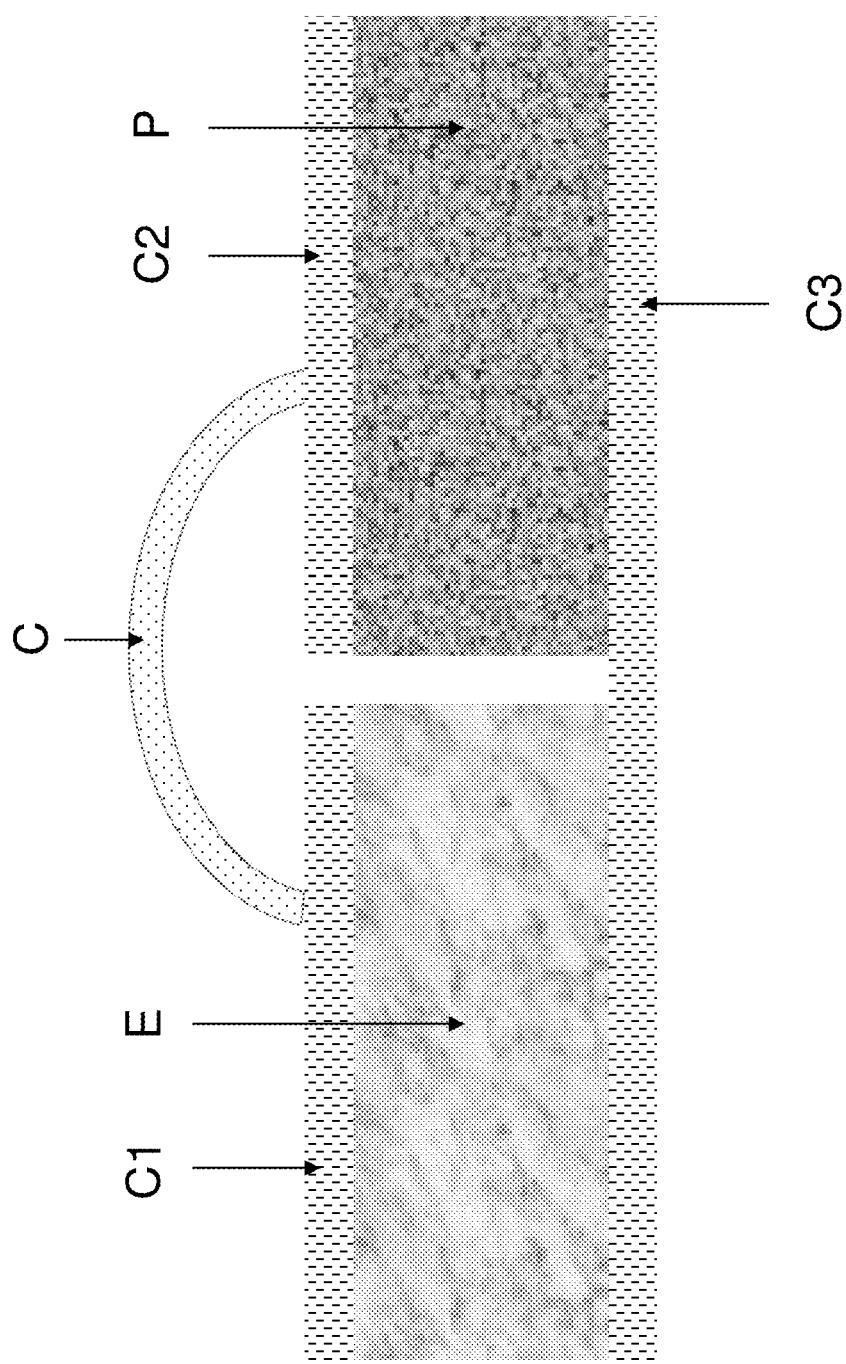

In FIG. 5, the electrophoretic layer E and the piezo material layer (P) share a common bottom conductor layer C3. But the top conductor layers C1 and C2 are separate and as a result, a conductor line C is needed to connect the conductor layers C1 and C2. Because C1 and C2 are connected, the operation of this design is similar to that of FIG. 4.

The structure of FIG. 5 may be prepared in a similar manner as the structure of FIG. 4, except two separate conductor layers (C1 and C2) are laminated over the electrophoretic layer (E) and the piezo material (P), respectively.

Figure 6:
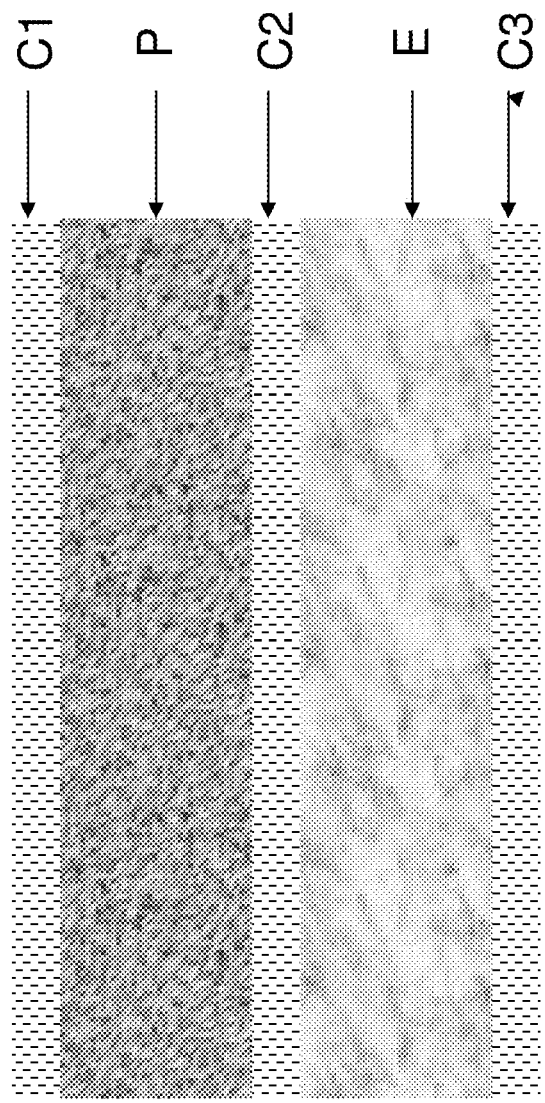

In FIG. 6, there are three conductor layers C1-C3. The piezo material layer (P) is sandwiched between conductor layers C1 and C2 and the electrophoretic layer (E) is sandwiched between conductor layers C2 and C3. The electrophoretic layer is driven by the voltage potential difference between C2 and C3.

The electrophoretic layer (E) in this design may be built on the set of layers C2-P-C1 and another conductor layer C3 is laminated over the electrophoretic layer (E).

Figure 7:
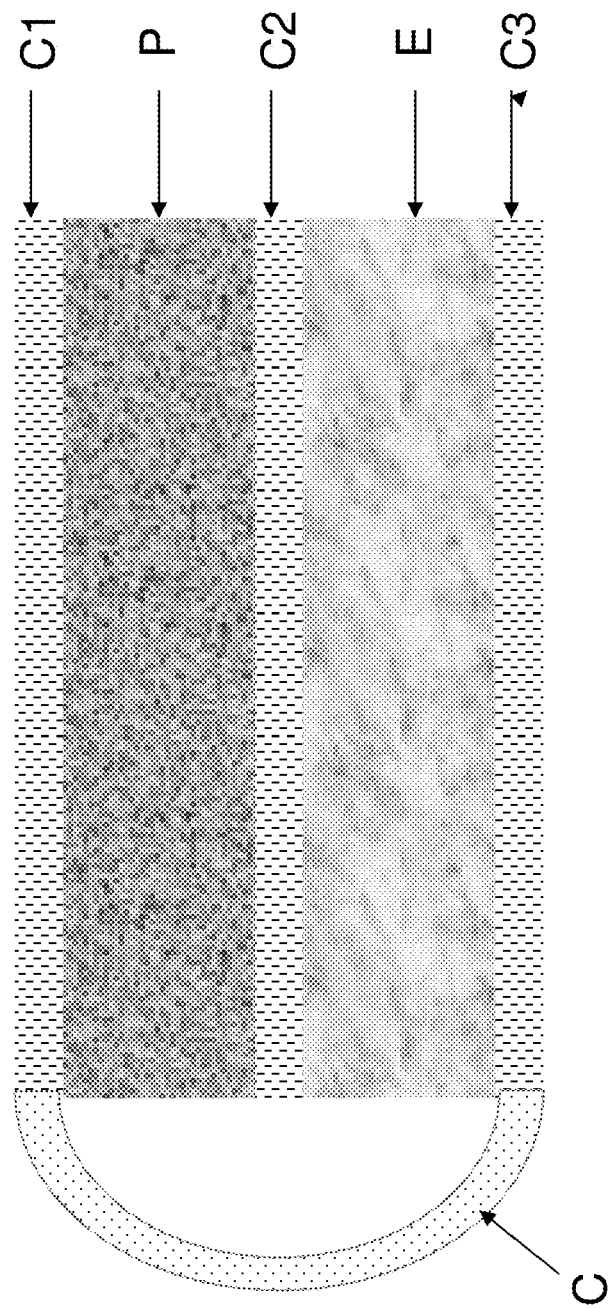

The design in FIG. 7 is similar to that of FIG. 6, except conductor layers C1 and C3 are connected through a conductor line (C). In this case, C1 and C3 have the same voltage potential.

Figure 8:
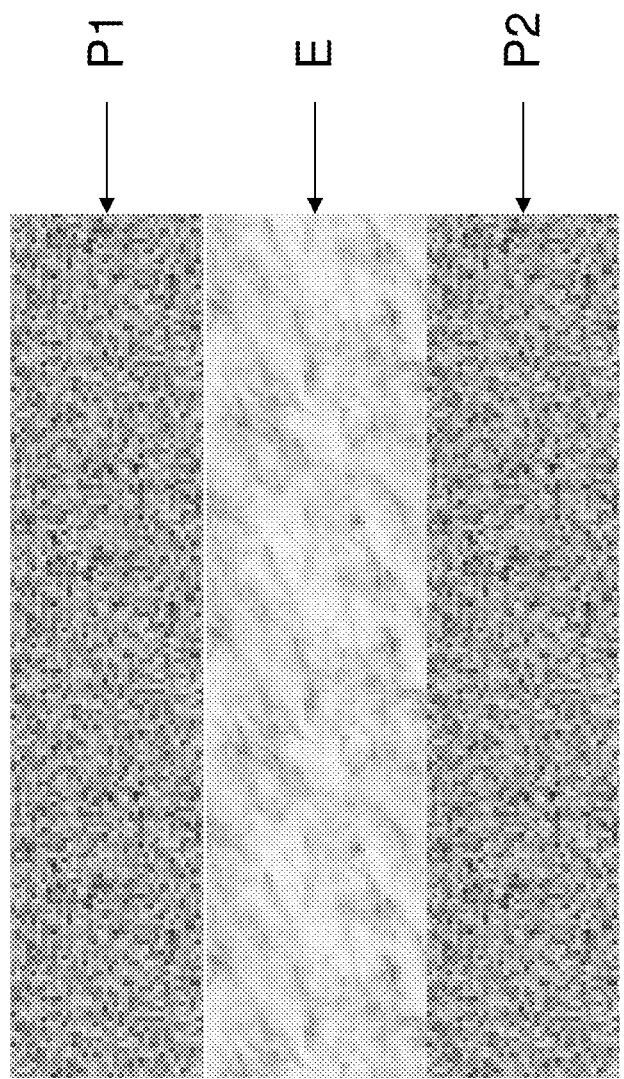

In FIG. 8, the electrophoretic layer (E) is sandwiched between two piezo material layers (P1 and P2). Under mechanical stress applied to the piezo layers, an electric field is generated to drive the electrophoretic layer.

Figure 9:
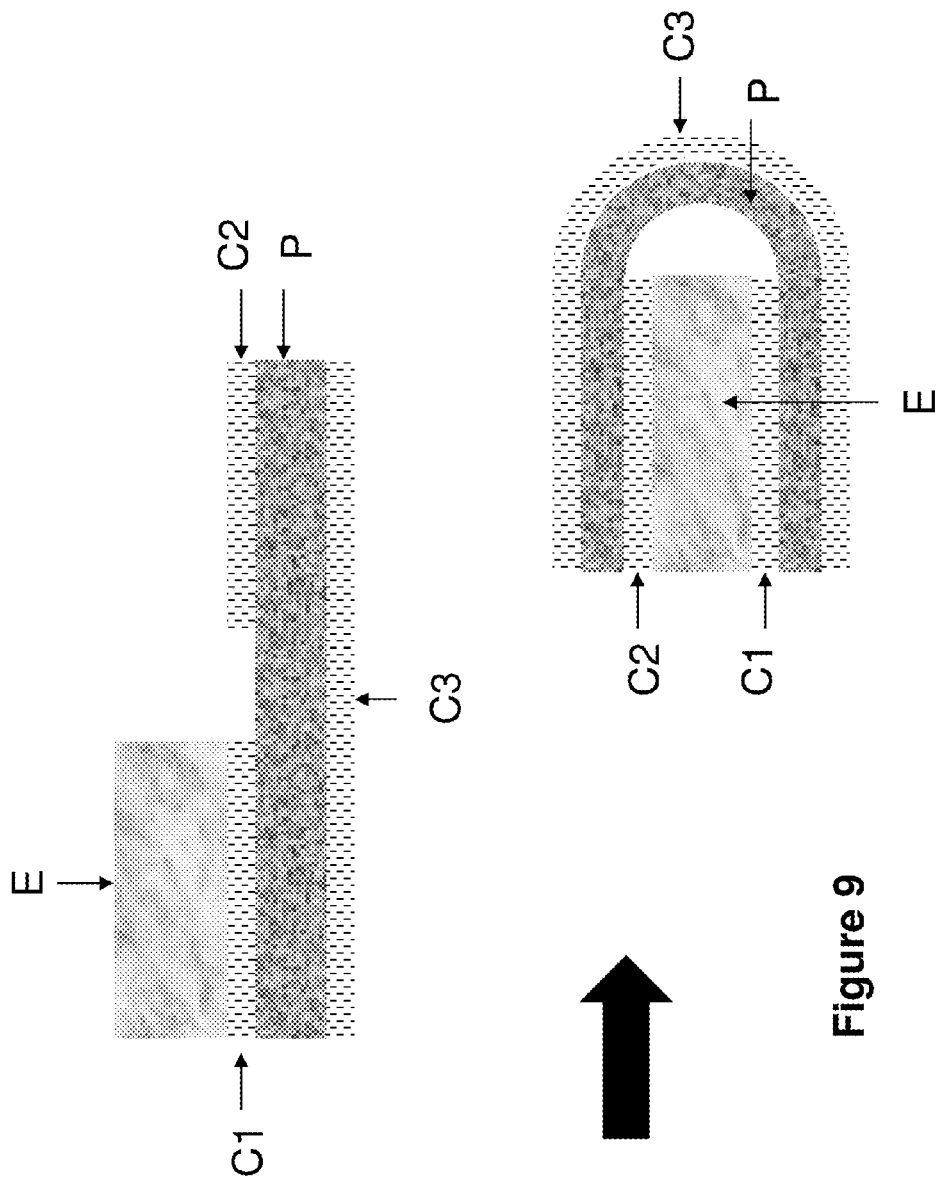
Figure 10:
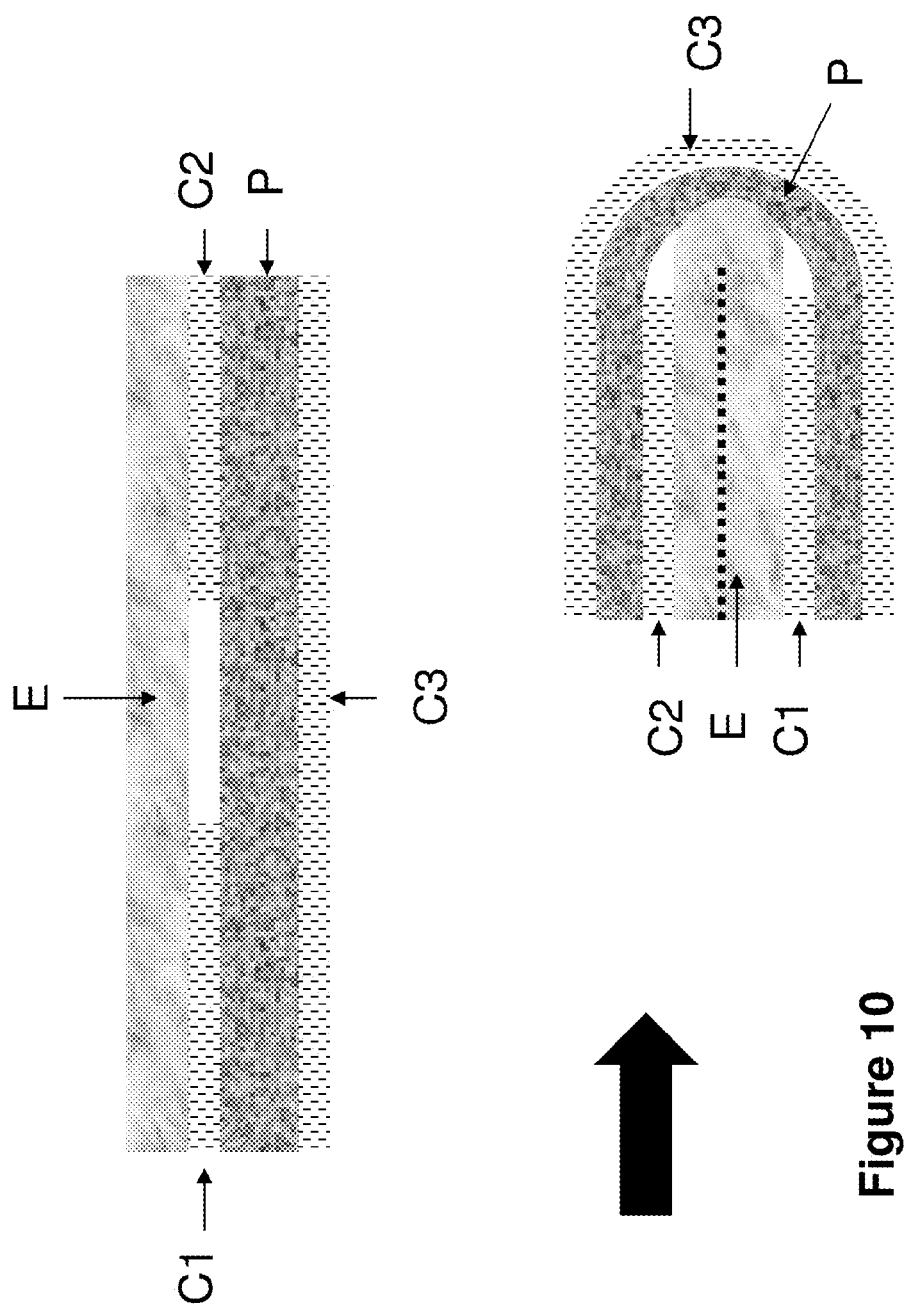

FIGS. 9 and 10 depict U-shaped piezo-electrophoretic designs.

In FIG. 9, initially a piezo material is sandwiched between one conductor layer C3 and, on the opposite side, two conductor layers C1 and C2. The conductor layers C1 and C2 are not in contact with each other. The electrophoretic layer (E) is placed only on top of one of the conductor layers (C1 or C2). To form the piezo-electrophoretic display, in this example, the C2-P-C3 side of the panel is folded over the electrophoretic layer (E). In this case, when mechanical stress is applied to the layer of the piezo material (P), a voltage potential difference is generated between the conductor layers C1 and C2 which drives the electrophoretic layer.

FIG. 10 depicts a similar design, except that the electrophoretic layer (E) extends substantially throughout the length of the piezo material (P). In this example, when the panel is folded into a U-shaped structure, there is also a folded electrophoretic layer between the conductor layers C1 and C2. The folded electrophoretic layer can be driven in the same manner as that in FIG. 9.

In any of the designs discussed above where there are more than one piezo material layer, the materials in different layers may be the same or different.

Figure 11B:
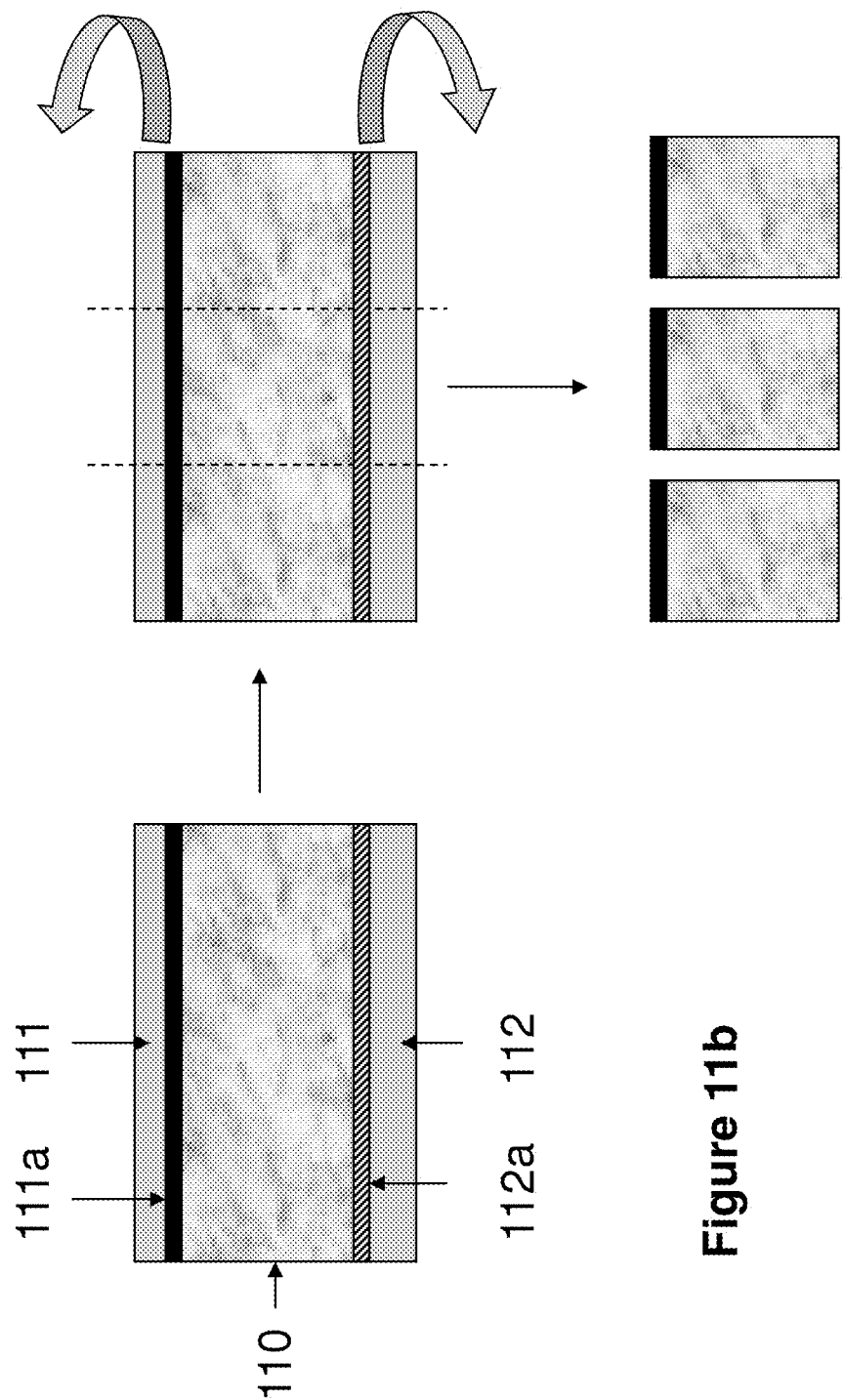

The preparation of an "electrophoretic layer or film" or "substrate-less electrophoretic layer or film" is shown in FIGS. 11a and 11b. As stated above, an "electrophoretic layer or film" or "substrate-less electrophoretic layer or film", in the context of the present application, does not have a conductor layer and/or a substrate layer (such as a PET layer on which a conductor layer is laminated) attached to it.

The electrophoretic layer or film comprises an electrophoretic fluid filled within micro-containers (such as microcups as described in U.S. Pat. No. 6,930,818 or microcapsules as described in U.S. Pat. No. 5,930,026, which are incorporated herein by references) and any dielectric layers that support the electrophoretic fluid, including, for example, a binder material, a matrix material, an adhesive layer, a sealing layer, a primer layer or any other electrode-protecting layers to provide functional support.

In the case of a microcup-based electrophoretic layer, the microcups are formed on the substrate layer, which are then filled with an electrophoretic fluid and sealed. In the case of a microcapsule-based electrophoretic layer, the microcapsules, with an electrophoretic fluid enclosed within, are mixed with a binder material and the mixture is coated onto a substrate layer.

Both manufacturing processes for the microcup-based or microcapsule-based electrophoretic assembly described above may be carried out on a continuous format. The microcup-based electrophoretic layer may even be manufactured by a roll-to-roll continuous process. As a result, the electrophoretic layer formed by either the microcup or microcapsule technology is continuous along the web direction, or substantially continuous, which means that there is no intentional disruption of the electrophoretic layer along the web direction. If there is any disruption, usually it involves very small areas and exists as only a result of imperfection of the process.

As shown in FIG. 11, an electrophoretic layer (110) is sandwiched between a substrate layer (112) and a release liner (111). The substrate layer (112) may comprise an electrode layer (not shown) and optionally other layers such as a release layer (112a). The release liner (111) is laminated over the electrophoretic layer optionally with an adhesive layer (111a).

To form a substrate-less electrophoretic layer or film, the substrate layer (112) and layers associated with the substrate layer are removed, which may be accomplished by mechanical means (such as scraping). The substrate layer itself may also have releasing property. If an optional release layer (112a) is present between the substrate layer (112) and electrophoretic layer (110), and in that case, the release layer (112a) may trigger release of the substrate layer (112), by laser, UV light, heat or the like. The release layer (112a) can be tuned to give enough hold for the formation of microcups during embossing, yet still be able to be released from them, when needed.

It is also possible to peel the substrate layer apart from the electrophoretic layer.

The release liner (111) may be peeled off. The adhesive layer (111a), if present, may remain on the electrophoretic layer. If there is no adhesive layer in the original assembly, the adhesive layer may be applied later when the separated electrophoretic layers are transferred.

After removal of the substrate layer (112) along with other optional layers and the release liner, the remaining electrophoretic layer may be cut into pieces of desired dimensions. The cutting may be accomplished by kiss cutting or the like.

FIG. 11b shows an alternative sequence of manufacturing of a substrate-less electrophoretic layer or film. In this case, the cutting takes place before removal of the substrate layer (112) along with other optional layers and the release liner (111).

Figure 12:
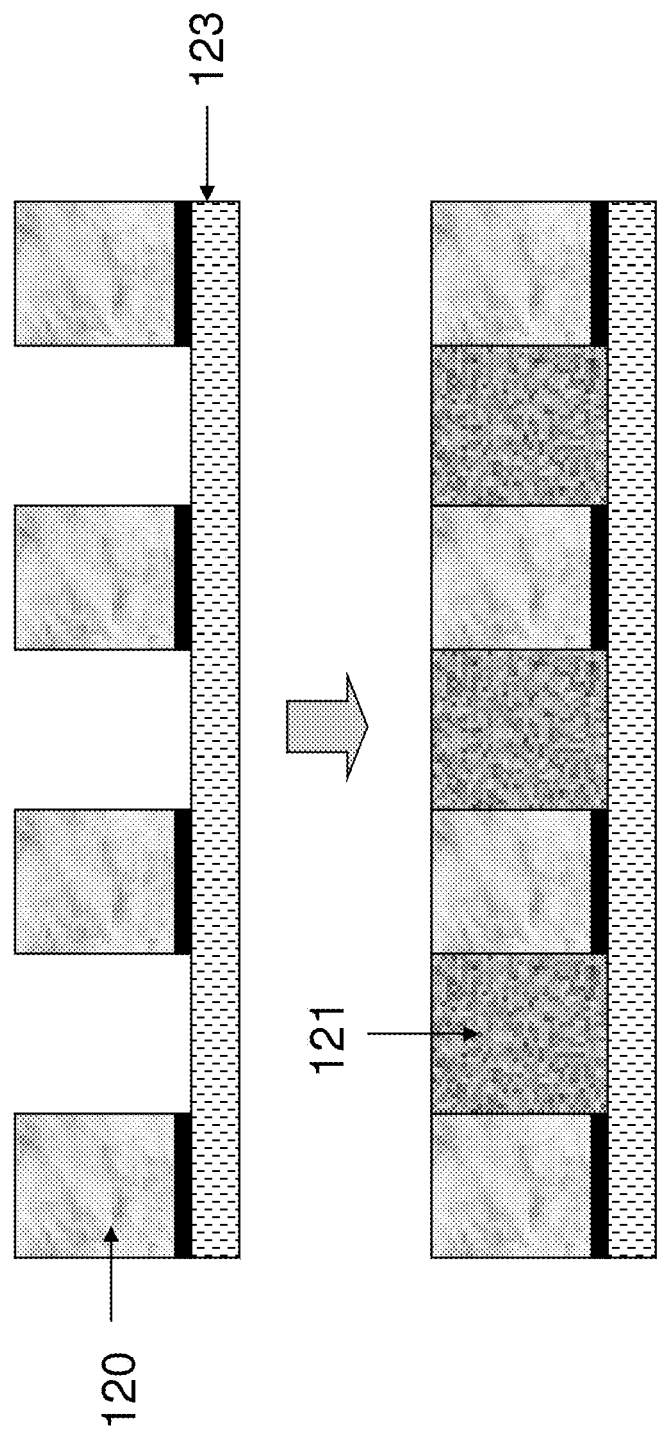
FIG. 12 depicts the forming of a film with alternating electrophoretic material and piezo material.

In FIG. 12, the separated electrophoretic layers are transferred onto a conductor layer (123). The spaces between the electrophoretic layers (120) are then filled with a piezo material (121). The piezo material can be integrated into the empty spaces on a web by any coating, printing or converting process. The piezo material will occupy at least the areas where there is no electrophoretic material. Some section of it may superimpose with the non-continuous electrophoretic material. It is also possible for the piezo material to be deposited first before transfer of the electrophoretic layers. Either process can be carried out in a stop-and-go fashion or in a continuous manner. The finished product with a pattern of alternating piezo material and electrophoretic layer may then be cut to form a piezo-electrophoretic assembly such as those shown in FIGS. 3-5.

It is also possible to stack the substrate-less electrophoretic layer or film with conductor layer(s) and layer(s) of a piezo material to assemble a structure such as those shown in FIGS. 1, 2 and 6-8.

The processes as exemplified in FIGS. 11-12 enable the integration of a roll of film, on which the electrophoretic layer is repeatedly interrupted by a non-electrophoretic material (in this case, a piezo material) along the web direction. This interruption of the electrophoretic material is intentionally done in order to place a non-electrophoretic material adjacent to it. The separated electrophoretic layers can have a well-defined shape with sharp boundaries, for example, rectangular shape covers a strip across the web direction.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, materials, compositions, processes, process step or steps, to the objective, spirit and scope of the present invention. All such modifications are intended to be within the scope of the claims appended hereto.

What is claimed is:

1. A piezo-electrophoretic display comprising: (a) a first layer of piezo material sandwiched between a first conductor layer and a second conductor layer, (b) a second layer of piezo material sandwiched between a third conductor layer and a fourth conductor layer and (c) an electrophoretic layer sandwiched between the second conductor layer and the third conductor layer.

2. The display of claim 1, wherein the first conductor layer and the fourth conductor layer are connected.

3. The display of claim 1, wherein the electrophoretic layer is microcapsule-based.

4. A piezo-electrophoretic display comprising: an electrophoretic layer sandwiched between a first conductor layer and a second conductor layer, a layer of piezo material sandwiched between a third conductor layer and a fourth conductor layer, the first conductor layer and the third conductor layer are connected, and the second conductor layer and the fourth conductor layer are connected.

5. A piezo-electrophoretic display comprising an electrophoretic layer sandwiched between a first conductor layer and a third conductor layer, a layer of piezo material sandwiched between a second conductor layer and the third conductor layer, wherein the first conductor layer and the second conductor layer are connected.

6. A piezo-electrophoretic display comprising a layer of piezo material sandwiched between a first conductor layer and a second conductor layer, and an electrophoretic layer sandwiched between the second conductor layer and a third conductor layer, wherein the first conductor layer and the third conductor layer are connected.

7. A piezo-electrophoretic display comprising an electrophoretic layer, a conductor layer, and a layer of piezo material, wherein the electrophoretic layer is microcup-based.

8. A U-shaped piezo-electrophoretic display comprising an electrophoretic layer sandwiched between a first conductor layer and a second conductor layer, and a layer of piezo material which, on one side, is in contact with the first conductor layer and the second conductor layer, and on the other side, is in contact with a third conductor layer, wherein the layer of the piezo material and the third conductor layer are folded into a U-shape.

9. The display of claim 8, wherein the electrophoretic layer is unfolded.

10. The display of claim 8, wherein the electrophoretic layer is folded.

11. The display of claim 8, wherein the electrophoretic layer is microcup-based.

12. The display of claim 8, wherein the electrophoretic layer is microcapsule-based.

* * * * *